United States Patent
Ma

(10) Patent No.: US 7,090,517 B2
(45) Date of Patent: Aug. 15, 2006

(54) ELECTRICAL CONNECTOR ASSEMBLY WITH PICK UP CAP

(75) Inventor: Hao-Yun Ma, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/999,016

(22) Filed: Nov. 29, 2004

(65) Prior Publication Data
US 2005/0124199 A1 Jun. 9, 2005

(30) Foreign Application Priority Data
Dec. 6, 2003 (CN) .................. 2003201203477

(51) Int. Cl.
*H01R 13/44* (2006.01)
(52) U.S. Cl. ..................... 439/135; 439/940
(58) Field of Classification Search ............... 439/135, 439/331, 940, 41
See application file for complete search history.

(56) References Cited

U.S. PATENT DOCUMENTS 6,877,990 B1* 4/2005 Liao et al. .................. 439/41

* cited by examiner

*Primary Examiner*—Javaid H. Nasri
(74) *Attorney, Agent, or Firm*—Wei Te Chung

(57) ABSTRACT

A land grid array connector assembly of the present invention includes an LGA connector and a pick up cap (6) attached thereon. The LGA connector includes an insulative housing (2), a plurality of contacts (24) received in the housing, a load plate (4) mounted on the housing, and a lever (5) pivotably mounted to the housing. The housing defines an electrical area (20) for receiving an IC package (7) therein. The load plate presses the IC package upon the contacts. The load plate has a generally rectangular window (40). The pick up cap has a plurality of clasps (65,66) disposed at two opposite sides, and a pair of protruding blocks (68) towards the load plate within the scope of the window. The protruding blocks resist on the IC package when the load plate in a close position, then the pick up cap can be removed automatically from the connector.

20 Claims, 5 Drawing Sheets

ELECTRICAL CONNECTOR ASSEMBLY WITH PICK UP CAP

BACKGROUND OF THE INVENTION

1. Field of the Invention

The invention is related to a land grid array (LGA) connector assembly which comprises an electrical connector and a pick up cap, the pick up cap being mounted on the connector for providing a flat top surface to be engaged by a vacuum suction device, whereby the LGA connector assembly can be moved onto a circuit substrate such as a printed circuit board (PCB) on which the connector is to be mounted.

2. Description of the Prior Art

At present, on many production lines, electronic components such as land grid array connectors are accurately positioned on circuit substrates such as printed circuit boards (PCBs) by means of vacuum suction devices. Such an LGA connector typically comprises an insulative housing, a plurality of electrical contacts received in the housing, a load plate pivotably mounted to an end of the housing, and a lever pivotably mounted to an opposite end of the housing for engaging with the load plate. The load plate has a generally rectangular window in a middle thereof. The contacts each have first contact portions protruding outwardly from a top portion of the housing, for electrically connecting with a multiplicity of metal contact pads of an IC package such as an LGA central processing unit (CPU). Because of this configuration of the LGA connector, a pick up cap has to be pre-attached on the top portion of the housing. The pick up cap has a generally rectangular body. Typically, a plurality of latches depends perpendicularly form sides of the body. The latches snappingly engage with corresponding sidewalls of the load plate, thereby mounting the pick up cap onto the LGA connector. The pick-up cap has a plane top surface exposed through the window. A vacuum suction device can accordingly engage on the top surface of the pick up cap, in order to reliably move the LGA connector and accurately position it onto the PCB.

Referring to FIGS. 1 and 2, an LGA connector assembly is illustrated. The LGA connector assembly comprises an LGA connector 8 and a pick up cap 9 attached thereon. The LGA connector comprises an insulative housing 81, a plurality of contacts (not shown) received in the housing 81, a metal stiffener 84 partly covering and reinforcing the housing 81, a metal load plate 82 pivotably mounted to an end of the stiffener 84, and a lever 83 pivotably mounted to an opposite end of the stiffener 84 for engaging with the load plate 82. The pick up cap 9 has a flat plate for being sucked by a vacuum suction device, and a plurality of latched 92 depending from the flat plate for snappingly engaging with the metal load plate 82.

In attaching the pick up cap 9 onto the connector 8, the pick up cap 9 is disposed on the connector 8. The connector 8 is accurately positioned and mounted onto the PCB with the pick up cap 9 being sucked by a vacuum suction device. Then an LGA package (not shown) is mounted onto the connector 8 and engaged with the contacts which electrically engage with the PCB. The pick up cap 9 is still attached onto the connector 8. But the connector 8 needs a heat sink to cool the LGA package. The pick up cap 9 must be removed from the connector 8 firstly through another step consuming more work time.

In view of the above, a new land grid array connector assembly with an improved pick up cap which overcomes the above-mentioned disadvantage is desired.

SUMMARY OF THE INVENTION

Accordingly, an object of the present invention is to provide a land grid array (LGA) connector assembly which has an LGA connector and a pick up cap mounted onto the connector, wherein after engaging a LGA package with the connector the pick up cap can be removed automatically within a short time, thereby decreasing the cost.

To achieve the above-mentioned object, a land grid array connector assembly accordance with a preferred embodiment of the present invention comprises an LGA connector and a pick up cap mounted onto the connector. The connector comprises an insulating housing and a load plate. The insulating housing defines a number of cells for receiving a corresponding number of contacts. The load plate has a substantially plate configuration with a generally rectangular window in a middle thereof. The pick up cap defines at least one protruding block which can resist on the IC package and be removed from the connector automatically.

Other objects, advantages and novel features of the invention will become more apparent from the following detailed description when taken in conjunction with the accompanying drawings, in which:

DETAILED DESCRIPTION OF THE PREFERRED EMBODIMENT OF THE INVENTION

Reference will now be made to the drawings to describe the present invention in detail.

Figure 1:
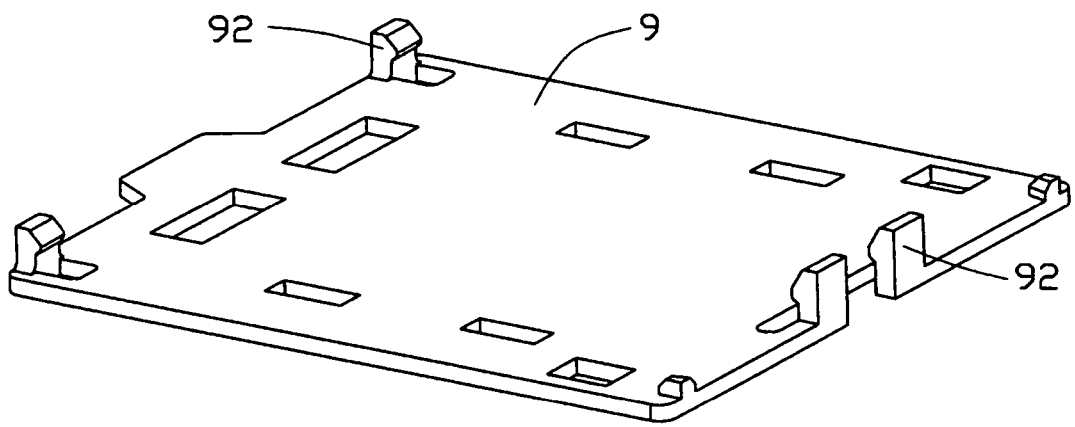
FIG. 1 is an isometric view of a conventional pick up cap.
Figure 2:
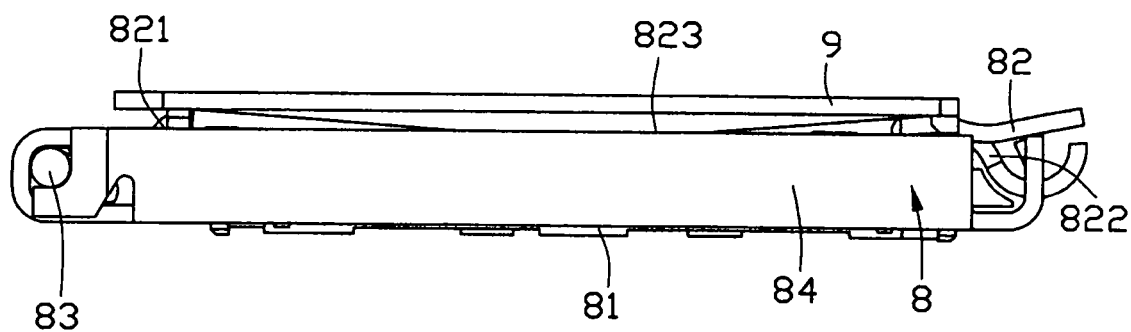
FIG. 2 is an assembled side view of a conventional electrical connector and a conventional pick up cap.
Figure 3:
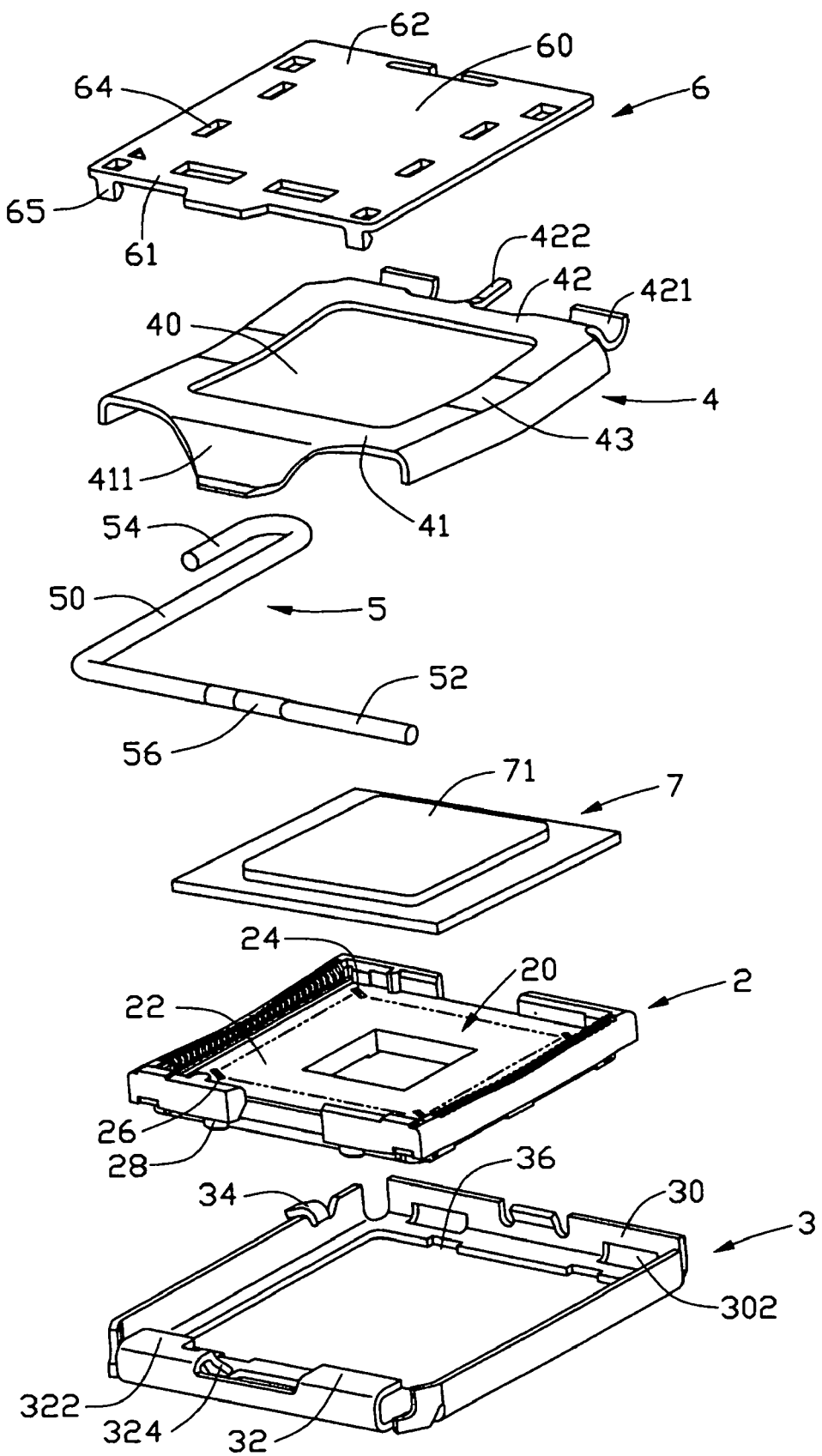
FIG. 3 is an exploded isometric view of an LGA connector assembly in accordance with the preferred embodiment of the present invention, the LGA connector assembly comprising an LGA connector and a pick up cap mounted onto the connector.
Figure 4:
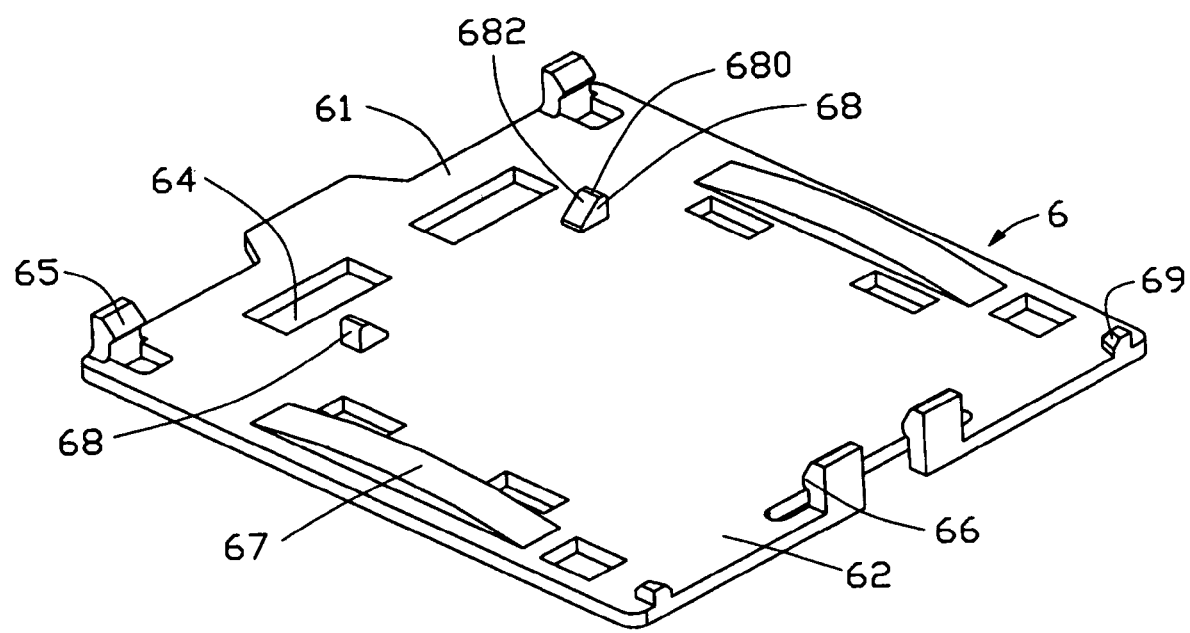
FIG. 4 is an isometric view of the pick up cap of the present invention.
Figure 5:
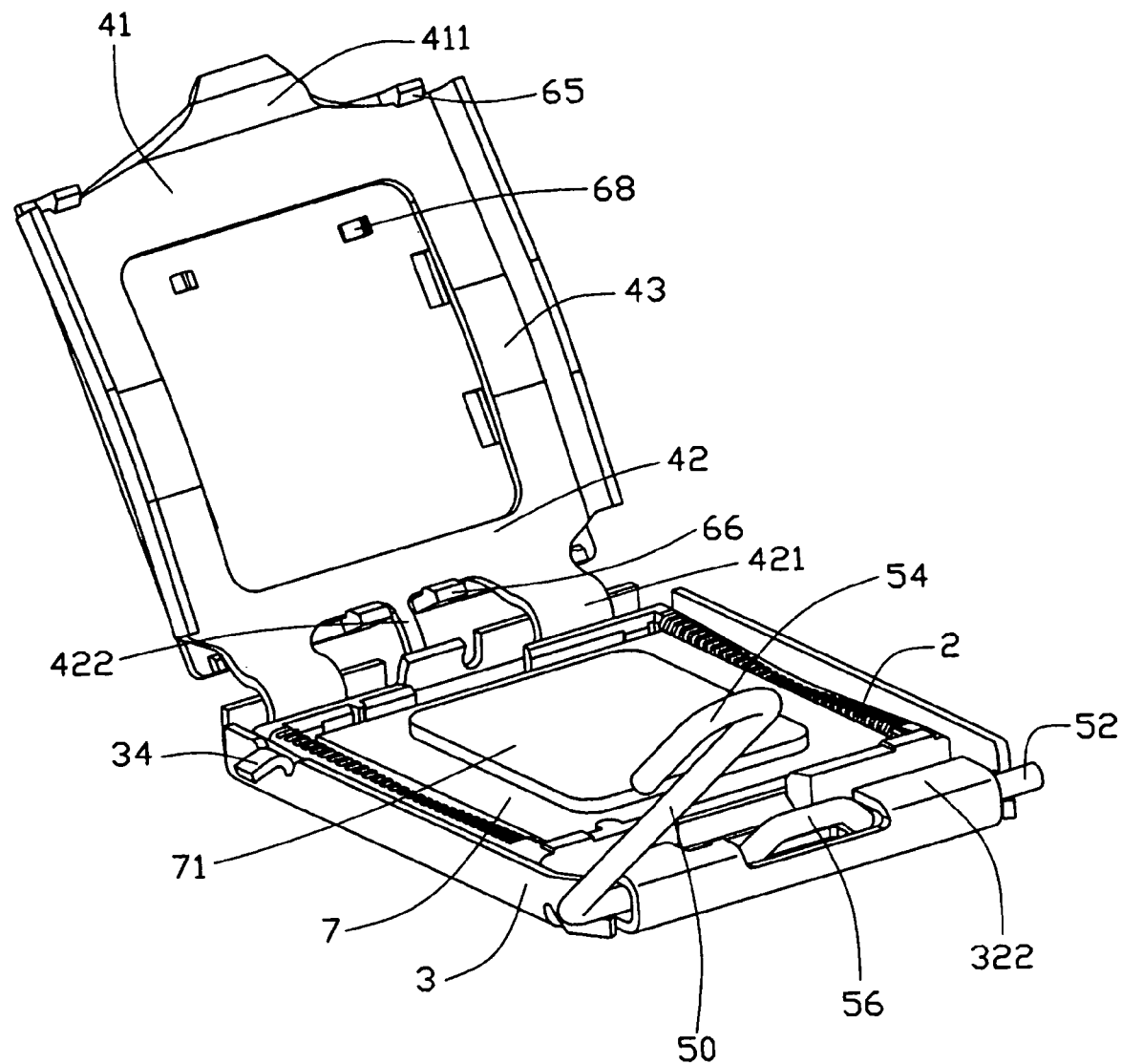
FIG. 5 is an assembled isometric view of the present LGA connector assembly when the connector is in its open position.
Figure 6:
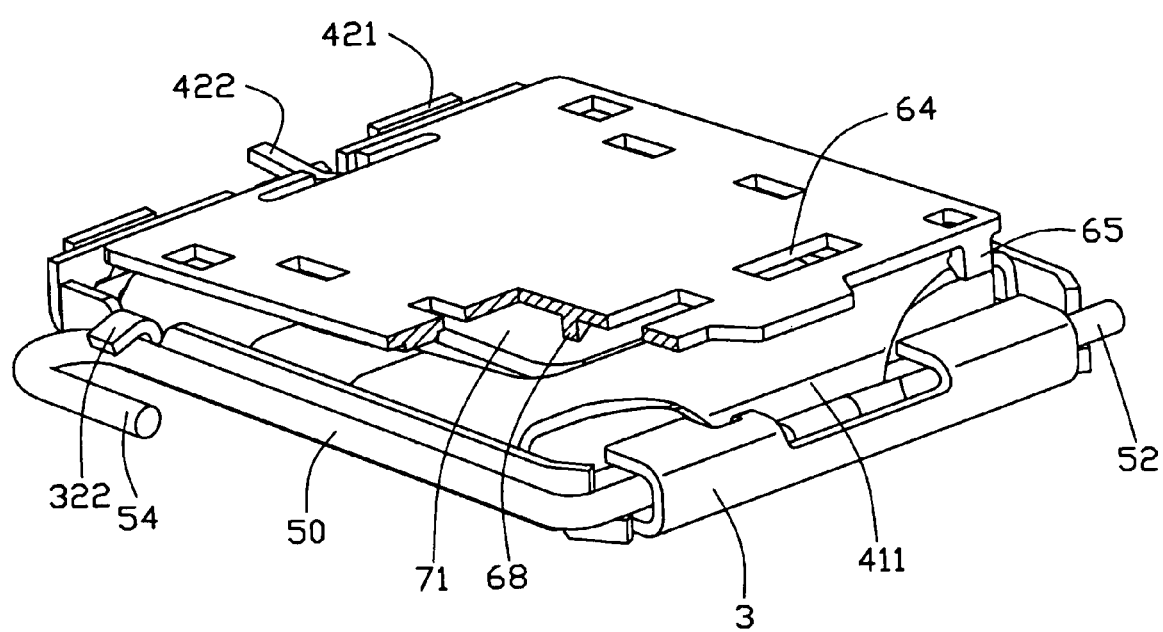
FIG. 6 is an assembled isometric view of the present LGA connector assembly when the connector is in its close position.

Referring to FIGS. 3 to 6, a connector assembly comprises a land grid array connector and a generally rectangular pick up cap 6. The connector comprises a generally rectangular insulative housing 2, a multiplicity of contacts 24 received in the housing 2, a metal stiffener 3 partly covering and reinforcing the housing 2, a lever 5 pivotably received in an end of the stiffener 3, a metal load plate 4 pivotably mounted to an opposite end of the stiffener 3 for engaging with the lever 5. A vacuum suction device can accordingly engage on the pick up cap 6 in order to reliably move the LGA connector and accurately position it onto the PCB.

The housing 2 defines a generally rectangular electrical area 20 in the middle thereof which is used for receiving an IC package 7 such as an LGA central processing unit (CPU). The electrical area 20 defines a multiplicity of terminal-passages 26, the terminal-passages 26 receiving a corresponding number of the contacts 24 therein respectively. The up side of the electrical area 20 is a touch plane 22. Each contacts 24 have a contacting portion (not shown) protruding outwardly from top face of the electrical area 20, for resiliently electrically contacing a corresponding pad of the IC package 7.

The IC package 7 defines an IHS (integrative heat sink) 71 on the opposite side of the contacts 24. The IHS 71 can mount a thermal fan to cool the IC package 7 when the IC package 7 is working.

The lever 5 comprises an operating portion 50 and a locating portion 52 which is generally perpendicular to the operating portion 50, the other end of the operating portion 50 defines a handing portion 54 outwardly, the middle of the locating portion 52 defines an offset actuating portion 56.

The load plate 4 is generally rectangular with a window 40 in the middle thereof. The load plate 4 comprises a first side 41 with an engaging portion 411 extending from thereof and a second side 42 with a pair of spaced securing portions 421 and a tail 422 extending from thereof. The tail 422 is at the middle of the pair of spaced securing portions 421. The middle of other two sides of the load plate 4 defines a pressed portion 43 respectively. The pressed portion 43 protrudes to the side of the housing 2 in order to press the IHS 71 of the IC package 7. Then the pads of the IC package 71 contact electrically with the contacts 24.

The stiffener 3 comprises four sides connecting with each other and four walls extending upwardly form the sides respectively around the housing 2, a first wall 30 is corresponding to the second side 42 of the load plate 4 and a second wall 32 is corresponding to the first side 41 of the load plate 4. The first wall 31 defines a pair of block openings 302 corresponding to the pair of spaced securing portions 421 of the load plate 4 respectively. The block openings 302 engage with the spaced securing portions in order to mount the load plate 4 onto the stiffener 3. The second wall defines a pair of block portion 322, a securing portion 324 extends form one of the block portion 322. The lever 5 can be mounted on the second wall 32 with the block portion 322 and the securing portion 324 securing the lever 5 thereof. One wall between the first wall 31 and the second wall 32 defines a protruding piece 34 like a hook to securing the handing portion 54 of the lever The two sides opposite each other of the stiffener 3 define a pair of grooves 36 corresponding to the positioning portions 28 of the housing 2 respectively.

The pick up cap 6 has a top surface 60. The top surface 60 is the first side. A side opposite to the first side is the second side. A multiplicity of holes 64 is defined in the pick up cap 6. A first end 61 is defined corresponding to the first side 41 of the load plate 4. A second end 62 is defined corresponding to the second side 42 of the load plate. A pair of first clasps 65 is formed at opposite sides of the first end 61 respectively. The first clasps 65 depend from the opposite sides of the top surface 60. A pair of second clasps 66 is formed at the second end 62. A pair of parallel arcuate ribs 67 is formed at the opposite lateral sides of the pick up cap 6 respectively. The ribs 67 depend from the opposite side of the top surface 60. The arcuate ribs 67 is corresponding to the pressed portions 43 of the load plate 4. The arcuate ribs 67 can depend on the pressed portions 43 when a vacuum suction device engages with the pick up cap 6 to move the connector. The arcuate ribs 67 can keep the pick up cap 6 from being destroyed by the press force of the vacuum suction.

A pair of protruding blocks 68 depends from the opposite side of the top surface 60 close to the first end 61. The protruding blocks 68 are towards the load plate 4 and the housing 2 within the scope of the window 40. The protruding blocks 68 are close the outside of the pick up cap 6. The protruding blocks 68 can rest on the IHS 71 of the IC package 7 when the pick up cap 6 is mounted on the load plate 4. The protruding blocks 68 are integral with the pick up cap 6. The protruding blocks 68 comprise a contact portion 680 and a slant portion 682 respectively. The contact portion 680 can resist on the IHS 71 of the IC package 7. The contact portion 680 has an arc configuration in order to protect the IHS 71. The protruding blocks 68 can also be defined on the pick up cap 6 close with the second clasps 66 within the scope of the window 40. The protruding blocks 68 can also be defined on other position within the scope of the window 40. The protruding blocks 68 can be other shape like semicircle.

The pick up cap 6 is mounted onto the load plate 4 of the connector with the first clasps 65 and the second clasps 66 clasping the edges of the load plate 4. The vacuum suction device can grip the pick up cap 6 to move the connector and accurately position it onto the PCB. Then the IC package 7 is put into the housing 2 of the connector after opening the load plate 4 of the connector. The load plate 4 is closed and the lever 5 is pivoted from a vertical position to a horizontal position while the offset actuating portion 56 of the lever 5 pressing on the engaging portion 411 of the load plate 4 and the protruding blocks 68 of the pick up cap 6 resisting on the IHS 71 of the IC package 7. The protruding blocks 68 bring distortion and the IHS 71 makes spring force against the pick up cap 6. The pick up cap 6 is removed automatically from the load plate 4 with the first clasps 65 and the second clasps 66 broking off from the load plate 4. So there is no need to add another step to remove the pick up cap 6 after mounting the IC package 7 into the housing 2 of the connector. Then a heat scatter is mounted on the connector to cool the IC package 7 during working.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An electrical connector assembly connecting an IC package and printed circuit board, comprising:
    an LGA connector comprising:
        an insulative housing defining a plurality of terminal-passage;
        a plurality of contacts received in corresponding terminal-passage respectively;
        a stiffener mounted around the housing;
        a load plate pivoted on the stiffener with a window in a middle thereof;
        a lever mounted on the stiffener; and
        a pick up cap engagingly mounted to the load plate, the pick up cap having at least one protruding block toward the housing within the scope of the window of the load plate, the protruding block resting on the IC package to remove the pick up cap automatically when the connector is in a close position.

2. The electrical connector assembly as claimed in claim 1, wherein the IC package has an integrative heat sink, and the protruding block rests on the integrative heat sink.

3. The electrical connector assembly as claimed in claim 2, wherein a pair of protruding blocks is defined on the pick up cap close to the edge within the scope of the window.

4. The electrical connector assembly as claimed in claim 3, wherein the protruding blocks of the pick up cap comprise a contact portion resting on the integrative heat sink and an incline portion.

5. The electrical connector assembly as claimed in claim 4, wherein the pick up cap defines a plurality of clasps clasping on the load plate.

6. The electrical connector assembly as claimed in claim 3, wherein the load plate has a pair of pressed portion protruding to the housing, the pick up cap defines a pair of ribs corresponding the pressed portions respectively.

7. The electrical connector assembly as claimed in claim 2, wherein the protruding block of the pick up cap each have an arc configuration.

8. The electrical connector assembly as claimed in claim 1, wherein said at least one protruding block is disposed close to one side edge of the window when the pick up cap is mounted onto the load plate.

9. A land grid array connector assembly, comprising:
a land grid array connector, comprising:
an insulative housing for receiving an IC package therein, the housing having a plurality of terminal-passage for receiving a plurality of contacts respectively;
a load plate being disposed on the housing and having a window in a middle thereof;
a pick up cap mounted on the load plate, the pick up cap defining a top surface and an opposite bottom surface thereof, a plurality of clasps and at least one protruding block on the bottom surface of the pick up cap, the protruding block extending downward into the middle window of the load plate and resting on the IC package to be removed automatically while the load plate is in a closed position.

10. The electrical connector assembly as claimed in claim 9, wherein a pair of protruding blocks is defined on the bottom surface of the pick up cap.

11. The electrical connector assembly as claimed in claim 10, wherein the protruding blocks are close to the edge within the scope of the window.

12. The electrical connector assembly as claimed in claim 11, wherein the protruding blocks of the pick up cap comprise a contact portion resting on the IC package and an incline portion.

13. The electrical connector assembly as claimed in claim 12, wherein the pick up cap defines a plurality of clasps clasping on the load plate.

14. The electrical connector assembly as claimed in claim 13, wherein the protruding blocks of the pick up cap each have an arc configuration.

15. The electrical connector assembly as claimed in claim 14, wherein the load plate has a pair of pressed portion protruding to the housing, the pick up cap defines a pair of ribs corresponding to the pressed portions respectively.

16. The electrical connector assembly as claimed in claim 9, wherein said at least one protruding block is further disposed close to one side edge of the window when the pick up cap is mounted onto the load plate.

17. A land grid array connector assembly, comprising:
a land grid array connector, comprising:
an insulative housing defining an upward cavity;
a plurality of contacts disposed in the housing with upper contact portions extending into the cavity;
an IC package received in the cavity and engaged with the upper contact portions;
a load plate being disposed on the housing and downwardly pressing the IC package for holding the IC package in position, a window defined in a middle portion of the load plate; and
a pick up cap mounted on the load plate, the pick up cap defining a top surface for vacuum suction, a plurality of clasps generally grasping the load plate, and a protruding block extending downward into the receiving cavity; wherein
said protruding block is dimensioned to be received in the cavity without interference when no IC package is located in the cavity and the load plate is in a locked position while to be seated upon and interfere with the IC package and experience an upward force from the IC package when the IC package is loaded in the cavity and the load plate is intended to downwardly move to the locked position so that the pick up cap is eventually forcibly upwardly kicked from the load plate by engagement between the IC package and the protruding block when the load plate is moved to the locked position to hold the IC package in the cavity.

18. The land grid array connector assembly as claimed in claim 17, wherein said protruding block is disposed away from a center of the window but close to one side edge of the window when the pick up cap is mounted onto the load plate.

19. The land grid array connector assembly as claimed in claim 18, wherein said load plate is pivotal relative to the housing along a pivot axis, and said side edge and said pivot axis are opposite to each other with a center of the window therebetween in a front-to-back direction.

20. The land grid array connector assembly as claimed in claim 19, wherein a pair of protruding blocks are disposed close to side edges of the window when the pick up cap is mounted onto the load plate.

* * * * *